United States Patent
Wang et al.

(10) Patent No.: US 7,229,502 B2
(45) Date of Patent: Jun. 12, 2007

(54) METHOD OF FORMING A SILICON NITRIDE LAYER

(75) Inventors: Ching-Tang Wang, Hsinchu (TW); Chin-Tung Niao, Hsinchu (TW); Keng-Hui Su, Hsinchu (TW); Huang-Sheng Chiu, Hsinchu (TW); Min-Hsin Wang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 434 days.

(21) Appl. No.: 10/710,193

(22) Filed: Jun. 24, 2004

(65) Prior Publication Data

US 2005/0266696 A1    Dec. 1, 2005

(51) Int. Cl.
   *C23C 16/00* (2006.01)
(52) U.S. Cl. ............... 118/715; 427/96.1; 427/96.8; 427/100; 118/504; 118/720; 118/723 R
(58) Field of Classification Search ............. 427/585, 427/96.1, 96.8, 100; 118/504, 715, 720, 118/723 R
See application file for complete search history.

(56) References Cited

U.S. PATENT DOCUMENTS

| | | | | |
|---|---|---|---|---|
| 4,640,023 A | * | 2/1987 | Mori et al. ............ | 34/583 |
| 5,935,334 A | * | 8/1999 | Fong et al. ............ | 118/723 ME |
| 6,413,887 B1 | * | 7/2002 | Fukuda et al. ........... | 438/792 |
| 6,824,666 B2 | * | 11/2004 | Gandikota et al. ........ | 205/183 |
| 7,084,724 B2 | * | 8/2006 | Cetiner et al. ........... | 333/262 |
| 2005/0062653 A1 | * | 3/2005 | Cetiner et al. ........... | 343/701 |

* cited by examiner

*Primary Examiner*—George Fourson
*Assistant Examiner*—Joannie Adelle Garcia
(74) *Attorney, Agent, or Firm*—Jianq Chyun IP Office

(57) ABSTRACT

A method of forming a silicon nitride layer is provided. A deposition furnace having an outer tube, a wafer boat, a gas injector and a uniform gas injection apparatus is provided. The wafer boat is positioned within the outer tube for carrying a plurality of wafers. The gas injector is positioned between the outer tube and the wafer boat. Similarly, the uniform gas injection apparatus is positioned between the outer tube and the wafer boat. Gas injected into the uniform gas injection apparatus is uniformly distributed throughout the entire deposition furnace. To form a silicon nitride layer on each wafer, a silicon-containing gas is passed into the deposition furnace via the gas injector and a nitrogen-mixed carrier gas is passed into the deposition furnace via the uniform gas injection apparatus.

15 Claims, 1 Drawing Sheet

METHOD OF FORMING A SILICON NITRIDE LAYER

BACKGROUND OF INVENTION

1. Field of the Invention

The present invention relates to a method of forming a thin film. More particularly, the present invention relates to a method of forming a silicon nitride layer using a deposition furnace with a multi-aperture air injection apparatus.

2. Description of the Related Art

In the formation of thin films on a wafer, many deposition processes are deployed. A prominent method of forming thin films is chemical vapor deposition (CVD). To form a thin film by chemical vapor deposition, reactive gases are passed into a heated furnace so that the gases can react chemically with the wafers to form a thin layer of deposition on the wafer surface. In general, the deposition furnace for performing chemical vapor deposition can be classified into horizontal deposition furnaces and vertical deposition furnaces. Since a vertical deposition furnace tends to occupy less area than a horizontal deposition furnace, the vertical deposition furnace gradually replaces all horizontal deposition furnaces.

When a vertical deposition furnace is used to deposit a silicon nitride layer on wafers, reactive gases including dichlorosilane ($SiH_2Cl_2$) and ammonia ($NH_3$) are passed into the deposition furnace via gas injection pipes at the bottom of the deposition furnace. The gases react with the silicon wafers on a wafer boat set up inside the deposition furnace so that a layer of silicon nitride is deposited on each wafer. However, the method of passing reactive gases from the bottom of a vertical deposition furnace prevents gases, in particular, gases with a low reaction proportion, from reaching the top of the deposition furnace. Therefore, thickness of the silicon nitride layer on various wafers within the same wafer boat will show significant variations. In a micro electro-mechanical system, the reactant used for forming a silicon nitride layer including dichlorosilane and ammonia. In order to form a low stress silicon nitride film, the gas flow rate of dichlorosilane is larger than that of the ammonia. However, in the process of deposition, ammonia with a relatively small gas flow rate can not diffuse to the top of the deposition furnace. Therefore, the silicon nitride layer on various wafers within the same wafer boat will show low uniformity. Since only part of the wafers in the wafer board has a film stress low enough suitable for further processing, overall productivity of the deposition furnace is lowered.

Furthermore, in a micro electro-mechanical system, a silicon nitride layer having a thickness between 7000 Å to 10000 Å, compared with that of a conventional device, is required. Hence, the silicon nitride layer within a micro electro-mechanical system is more vulnerable to peeling than the silicon nitride layer of a conventional device if internal stress is high. For example, the micro integrated circuit device of an inkjet print head utilizes capillary effect to draw ink from an ink cartridge. When the silicon nitride layer is set up as part of an integrated circuit device on the chamber wall, the peeling of the silicon nitride layer from the chamber wall due to excessive stress will prevent the integrated circuit device from drawing ink. Consequently, the inkjet print head will fail to work. Hence, if a conventional vertical deposition furnace is used to fabricate the silicon nitride layer on wafers for forming the micro electro-mechanical system, the mass production of the deposition furnace will be very hard.

SUMMARY OF INVENTION

Accordingly, at least one objective of the present invention is to provide a method of forming a silicon nitride layer capable of mass-producing wafers for fabricating micro electro-mechanical devices.

A second objective of the present invention is to provide a method of forming a silicon nitride layer over all the wafers on a wafer boat such that the silicon nitride layer on each wafer has a uniform thickness.

To achieve these and other advantages and in accordance with the purpose of the invention, as embodied and broadly described herein, the invention provides a method of forming a silicon nitride layer. First, a deposition furnace is provided. The deposition furnace comprises an outer tube, a wafer boat, a gas injector and a uniform gas injection apparatus. The wafer board is set up within the outer tube for carrying a plurality of wafers. The gas injector is positioned between the outer tube and the wafer boat. Similarly, the uniform gas injection apparatus extends in a direction along the wafer boat between the outer tube and the wafer boat. Gas injected into the uniform gas injection apparatus is uniformly distributed inside the entire deposition furnace. The uniform gas injection apparatus is, for example, a multi-aperture gas injector that extends in a direction along the wafer boat. Thereafter, a silicon-containing gaseous source is passed into the deposition furnace via the gas injector and a nitrogen-mixed carrier gas is passed into the deposition furnace via the uniform gas injection apparatus to form a silicon nitride layer over the wafers. The flow rate of the silicon-containing gaseous source is larger than the nitrogen-containing gaseous source.

In the aforementioned process, the uniform gas injection apparatus distributes nitrogen, which has a smaller flow rate, uniformly inside the deposition furnace. Therefore, the silicon-containing gases and the nitrogen-contain gases can mix together in an substantially similar proportion everywhere inside the deposition furnace so that a silicon nitride layer with an uniform thickness and a low internal stress is formed on each wafer within the wafer boat. In other words, wafers with a thicker silicon nitride layer and a lower internal stress that meet the demands for fabricating micro electro-mechanical systems are produced.

The present invention also provides an alternative method of forming a silicon nitride layer. First, a deposition furnace is provided. The deposition furnace comprises an outer tube, a wafer boat, a gas injector and a uniform gas injection apparatus. The wafer board is set up within the outer tube for carrying a plurality of wafers. The gas injector is positioned between the outer tube and the wafer boat. Similarly, the uniform gas injection apparatus and extends in a direction along the wafer boat between the outer tube and the wafer boat. Gas injected into the uniform gas injection apparatus is uniformly distributed inside the entire deposition furnace. The uniform gas injection apparatus is a multi-aperture gas injector extends in a direction along the wafer boat. Thereafter, a first reactive gaseous source is passed into the deposition furnace via the gas injector and a second reactive gaseous source is passed into the deposition furnace via the uniform gas injection apparatus to form a silicon nitride layer over the wafers. The flow rate of the first reactive gaseous source is larger than the second reactive gaseous source.

In the aforementioned process, the uniform gas injection apparatus distributes the second reactive gaseous source, which has a smaller flow rate, uniformly inside the deposition furnace. Therefore, during the silicon nitride deposition process, the first reactive gaseous source and the second reactive gaseous source can mix together in an substantially similar proportion everywhere inside the deposition furnace.

In other words, all the wafers within the wafer boat receive an almost uniform deposition.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
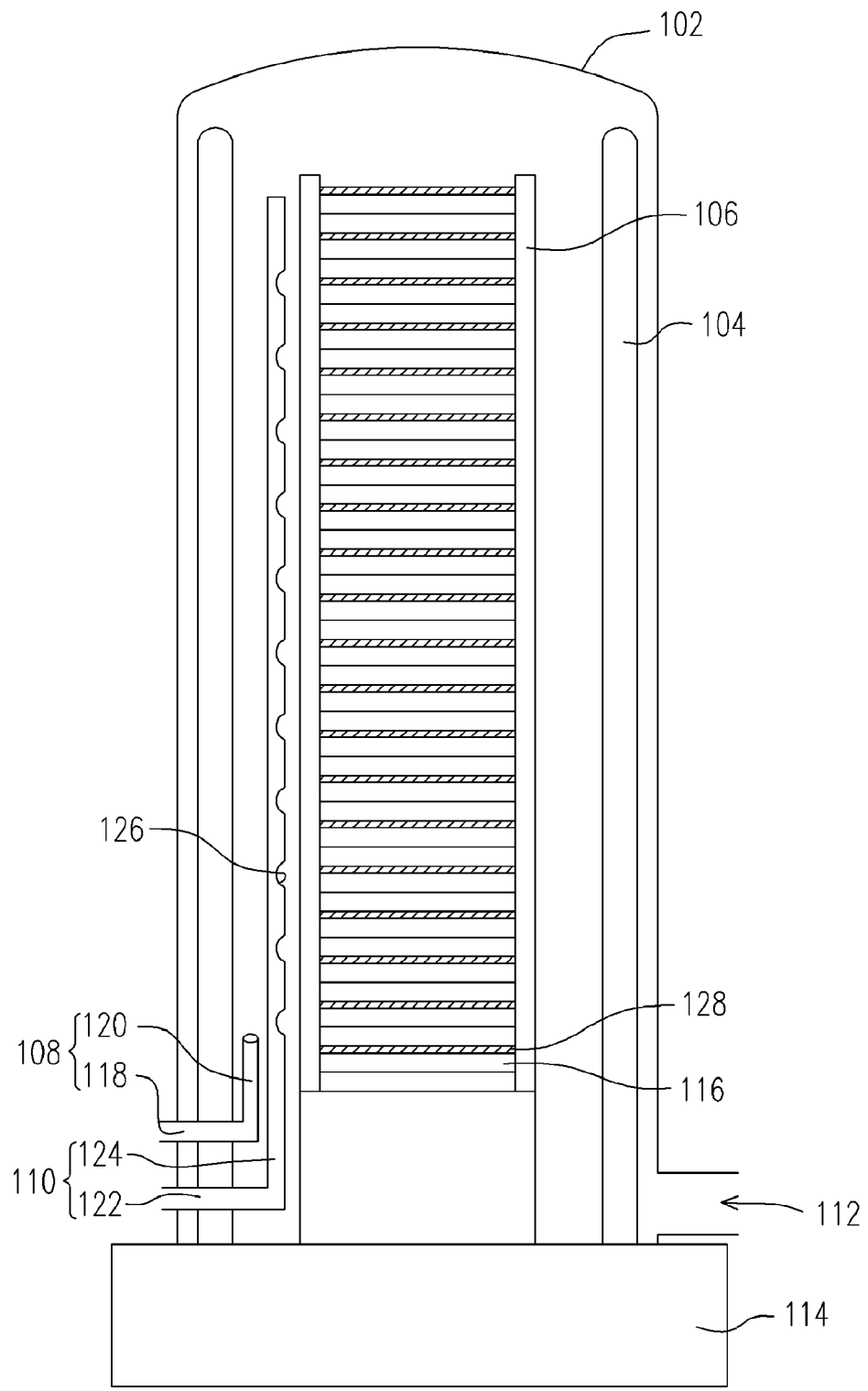
FIG. 1 is a schematic cross-sectional view of a vertical deposition furnace according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

In the following, a vertical deposition furnace is used to illustrate the method of the present invention.

FIG. 1 is a schematic cross-sectional view of a vertical deposition furnace according to one preferred embodiment of the present invention. Before performing the process of depositing silicon nitride over a set of wafers, a vertical deposition furnace 100 as shown in FIG. 1 is provided. The vertical deposition furnace 100 comprises an outer tube 102, an inner tube 104, a wafer boat 106, an air injector 108 and a uniform gas injection apparatus 110. The uniform gas injection apparatus 110 can be a multi-aperture gas injector or other gas injection apparatus suitable for evenly distributing gases within the deposition furnace 100.

The inner wall of the outer tube 102 defines a deposition chamber. The wall of the outer tube 102 is fabricated using quartz, for example. Furthermore, the outer tube 102 may include a gas exhaust terminal 112. The gas exhaust terminal 112 is connected to a pump (not shown) for pumping reaction byproducts or non-reacted gases out of the reaction chamber. The inner tube 104 is set up inside the outer tube 102. The inner tube 104 is also fabricated using a material including quartz. The wafer boat 106 is positioned within the inner tube 104 above a boat stand 114 for holding a plurality of wafers 116.

The gas injector 108 comprises a gas input section 118 and a gas output section 120. The gas input section 118 penetrates through the base 130 to join up with the gas output section 120. The gas output section 120 is positioned between the inner tube 104 and the wafer boat 106 for delivering reactive gases into the deposition furnace 100.

The multi-aperture gas injection apparatus 110 comprises a gas input section 122 and an extension section 124. The extension section 124 of the gas injection apparatus 110 has a plurality of holes 126 for delivering gases. The input section 122 penetrates through the base 130 to join up with the extension section 124. The extension section 124 is positioned between the inner tube 104 and the wafer boat 106 and extends vertically in a direction besides the wafer boat 106. The gas delivering holes 126 along the extension section 124 is able to diffuse the reactive gases evenly within the deposition furnace 100. In general, the length of the extension section 124 and the number of gas delivering holes 126 on the extension section 124 have no particular restrictions. The principal criterion in the design is the capacity to distribute the reactive gases evenly everywhere within the deposition furnace 100. In one preferred embodiment of the present invention, the total number of gas delivering holes 126 on the extension section 124 is greater than 5.

Thereafter, a first gaseous reactant is injected into the deposition furnace 100 through the gas injector 108 and a second gaseous reactant is delivered into the deposition furnace 100 through the multi-aperture gas injection apparatus 110. The gas flow rate of the first gaseous reactant is greater than the second gaseous reactant. In one embodiment of the present invention, the first gaseous reactant is a nitrogen-containing gaseous source and the second gaseous reactant is a silicon-containing gaseous source. Hence, a nitrogen-rich silicon nitride layer is formed on each wafer after the deposition. In another embodiment of the present invention, the first gaseous reactant is a silicon-containing gaseous source and the second gaseous reactant is a nitrogen-containing gaseous source. Thus, a silicon-rich silicon nitride layer is formed on each wafer after the deposition. The aforementioned silicon-containing gaseous source can be dichlorosilane ($SiH_2Cl_2$) or other suitable gaseous source and the nitrogen-containing gaseous source can be ammonia ($NH_3$) or other suitable gaseous source, for example.

Furthermore, in one case, the gas injector 108 is similar to the multi-aperture gas injection apparatus 110 shown in FIG. 1. The gas injector 108 comprises a gas input section and an extension section. The extension section of the gas injector 108 has a plurality of holes for delivering gases.

Because the multi-aperture gas injection apparatus 110 has a plurality of gas delivering holes 126, the second gaseous reactant with a relatively small gas flow rate is able to distribute evenly within the deposition furnace 100. In other words, the first gaseous reactant and the second gaseous reactant can mix together in a constant proportion everywhere within the deposition furnace 100. Consequently, a uniform layer silicon nitride layer is formed on all the wafers 116 from the bottom to the top of the wafer boat 106 after performing the deposition process inside the deposition furnace 100.

To meet the demand for a low internal stress in the silicon nitride layer of a micro electro-mechanical system (MEMS), a silicon-rich silicon nitride layer is preferably formed. In one of the aforementioned embodiment, the silicon-containing gaseous reactant is dichlorosilane and the nitrogen-containing gaseous reactant is ammonia. Furthermore, the gas flow rate between dichlorosilane and ammonia is at least large than 3:1, for example. The gas flow rate of dichlorosilane is set to about 450 ml per unit time and the gas flow rate of ammonia is set to about 90 ml per unit time. During the silicon nitride deposition process, the present of gas delivering holes 126 on the multi-aperture gas injection apparatus 110 facilitates the distribution of nitrogen-containing gaseous reactant (with a relatively small flow rate) evenly within the entire space of the reaction chamber. Consequently, the silicon-containing gaseous reactant and the nitrogen-containing gaseous reactant can mixed together in a constant proportion everywhere inside the deposition furnace 100. Therefore, a uniform and stress-relieved silicon nitride layer is formed on all the wafers from the bottom to the top of the wafer boat 106. In addition, the nitrogen-containing gaseous reactant, which has a smaller flow rate, is also mixed with a gaseous carrier to facilitate the transportation and the dilution of the nitrogen-containing gaseous reactant. In one embodiment, the gaseous carrier and the nitrogen-containing reactant are mixed together in a ratio between 1:1 to 10:1. The gaseous carrier can be nitrogen or other suitable gaseous and the nitrogen-containing reactant is ammonia or other suitable nitrogen-containing gaseous source, for example.

It should be noted that if the gaseous carrier and the nitrogen-containing reactant are mixed together in a ratio between 1:1 to 10:1 and the reaction inside the deposition furnace for forming the silicon nitride layer is carried out at a pressure between 0.1 torr to 1 torr, the silicon nitride layer of large than 100 wafers on the wafer boat 106 can have a low internal stress and a uniform thickness. In addition, the aforementioned method can produce a silicon nitride layer with a thickness greater than 3000 Å on a wafer to meet the minimum requirement for fabricating micro electro-mechanical system devices. Hence, the method is suitable for mass-producing micro electro-mechanical system devices.

In summary, major advantages of the present invention includes:

1. The uniform gas injection apparatus is able to distribute a second gaseous reactant with a relatively smaller flow rate evenly inside the deposition furnace. Therefore, the first gaseous reactant and the second gaseous reactant are combined together in a fixed proportion everywhere inside the deposition furnace. Consequently, the silicon nitride layer on all the wafers in the wafer boat is almost identical.

2. Because the silicon nitride layer on all the wafers from the bottom to the top of the wafer boat have the same uniform thickness, the number of good wafers fabricated in each wafer deposition process is increased.

3. Because the uniform gas injection apparatus is able to distribute nitrogen-containing gases evenly inside the deposition furnace, the ratio between the silicon-containing gases and the nitrogen-containing gases is everywhere the same during the silicon nitride deposition process. Since a thicker silicon nitride layer with a smaller internal stress suitable can be formed on all the wafers in the wafer boat, the method of the present invention is particularly suitable for fabricating micro electro-mechanical system devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A method of forming a silicon nitride layer suitable for producing micro electro-mechanical (MEM) devices, comprising the steps of:
   providing a deposition furnace, wherein the deposition furnace comprises:
     an outer tube;
     a wafer boat set up inside the outer tube for carrying a plurality of wafers;
     a gas injector that is positioned between the outer tube and the wafer boat, wherein the gas injector comprises a multi-aperture gas injector that extends vertically in a direction alone the wafer boat; and
     a uniform gas injection apparatus that is positioned between the outer tube and the wafer boat, wherein the gases injected into the uniform gas injection apparatus are evenly distributed within the deposition furnace; and
   injecting a silicon-containing gaseous reactant into the deposition furnace via the gas injector and injecting a nitrogen-containing reactant mixed with a carrier gas into the deposition furnace via the uniform gas injection apparatus to form a silicon nitride layer on the wafers, wherein the gas flow rate of the silicon-containing gaseous reactant is greater than the nitrogen-containing gaseous reactant.

2. The method of claim 1, wherein the uniform gas injection apparatus comprises a muilti-aperture gas injector that penetrates through a wall of the outer tube and extends vertically in a direction along the wafer boat.

3. The method of claim 2, wherein the multi-aperture gas injection apparatus has at least 5 delivery holes.

4. The method of claim 1, wherein the gas flow rate between the silicon-containing gaseous reactant and the nitrogen-containing gaseous reactant is set to a ratio of at least large than 3:1.

5. The method of claim 4, wherein the silicon-containing gaseous reactant comprises dichiorosilane ($SiH_2Cl_2$).

6. The method of claim 4, wherein the nitrogen-containing gaseous reactant comprises ammonia ($NH_3$).

7. The method of claim 1, wherein the mixing ratio between the gaseous carrier and the nitrogen-containing gaseous reactant is between 1:1 to 10:1.

8. The method of claim 7, wherein the carrier gas comprises nitrogen.

9. The method of claim 7, wherein the silicon nitride deposition process is carried inside the deposition furnace set to a pressure between 0.1 torr to 1 torr.

10. A method of forming a silicon nitride layer, comprising the steps of:
   providing a deposition furnace, wherein the deposition furnace comprises:
     an outer tube;
     a wafer boat set up inside the outer tube for carrying a plurality of wafers;
     a gas injector that is positioned between the outer tube and the wafer boat wherein the gas injector comprises a multi-aperture gas injector that extends vertically in a direction along the water boat; and
     a uniform gas injection apparatus that is position between the outer tube and the wafer boat, wherein the gases injected into the uniform gas injection apparatus are evenly distributed within the deposition furnace; and
   injecting a first gaseous reactant into the deposition furnace via the gas injector and injecting a second gaseous reactant into the deposition furnace via the uniform gas injection apparatus to form a silicon nitride layer on the wafers, wherein the gas flow rate of the first gaseous reactant is greater than the second gaseous reactant.

11. The method of claim 10, wherein the uniform gas injection apparatus comprises a multi-aperture gas injector that penetrates through a wall of the outer tube and extends vertically in a direction along the wafer boat.

12. The method of claim 11, wherein the multi-aperture gas injection apparatus has at least 5 delivery holes.

13. The method of claim 10, wherein the first gaseous reactant comprises a silicon-containing gaseous reactant and the second gaseous reactant comprises a nitrogen-containing gaseous reactant or vice versa.

14. The method of claim 13, wherein the silicon-containing gaseous reactant comprises dichlorosi lane ($SiH_2Cl_2$).

15. The method of claim 13, wherein the nitrogen-containing gaseous reactant comprises ammonia ($NH_3$).

* * * * *